US006410203B1

(12) United States Patent
Nakamura

(10) Patent No.: US 6,410,203 B1
(45) Date of Patent: Jun. 25, 2002

(54) POSITIVE-TYPE PLANOGRAPHIC PRINTING MATERIAL

(75) Inventor: Ippei Nakamura, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/511,710

(22) Filed: Feb. 23, 2000

(30) Foreign Application Priority Data

Feb. 24, 1999 (JP) .......................................... 11-047019

(51) Int. Cl.$^7$ ............................................... G03F 7/039

(52) U.S. Cl. .................................. 430/270.1; 430/286.1

(58) Field of Search ........................... 430/270.1, 281.1, 430/286.1, 302, 944, 945; 101/453, 463.1

(56) References Cited

U.S. PATENT DOCUMENTS

| | | | | | |
|---|---|---|---|---|---|
| 6,013,411 | A | * | 1/2000 | Aoai et al. | 430/270.1 |
| 6,083,658 | A | * | 7/2000 | Kunita et al. | 430/270.1 |
| 6,110,646 | A | * | 8/2000 | Urano et al. | 430/302 |
| 6,140,014 | A | * | 10/2000 | Uesugi et al. | 430/278.1 |
| 6,174,646 | B1 | * | 1/2001 | Hirai et al. | 430/302 |
| 6,177,230 | B1 | * | 1/2001 | Kawamura | 430/270.1 |
| 6,200,727 | B1 | * | 3/2001 | Urano et al. | 430/270.1 |
| 6,214,518 | B1 | * | 4/2001 | Kunita et al. | 430/270.1 |
| 6,218,073 | B1 | * | 4/2001 | Shimizu et al. | 430/273.1 |
| 6,235,451 | B1 | * | 5/2001 | Damme et al. | 430/302 |
| 6,238,838 | B1 | * | 5/2001 | Gaschler et al. | 430/278.1 |
| 6,238,839 | B1 | * | 5/2001 | Tomita et al. | 430/278.1 |
| 6,255,033 | B1 | * | 7/2001 | Levanon et al. | 430/275.1 |

* cited by examiner

*Primary Examiner*—Janet Baxter
*Assistant Examiner*—Barbara Gilmore
(74) *Attorney, Agent, or Firm*—Burns, Doane, Swecker & Mathis, LLP

(57) ABSTRACT

A positive-type planographic printing material contains (a) a water-insoluble and alkaline water-soluble polymer including a main chain and having a phenol structure in the main chain, the phenol structure having an aromatic ring and at least one electron-withdrawing substituent on the aromatic ring; and (b) an infrared absorbing agent.

13 Claims, No Drawings

POSITIVE-TYPE PLANOGRAPHIC PRINTING MATERIAL

BACKGROUND OF THE INVENTION

1. Field of the Invention

The present invention generally relates to a positive-type planographic printing plate which is sensitive to light having a wavelength in the infrared region. More particularly, the present invention relates to a positive-type planographic printing plate which can be directly formed by using an infrared laser based on digital signals output from a computer or the like.

2. Description of the Related Art

In recent years, laser technologies have developed remarkably. In particular, high output and compact solid-state lasers and semiconductor lasers emitting infrared rays of a wavelength of 760 nm to 1,200 nm (hereinafter occasionally referred to as "infrared lasers") are readily available. These infrared lasers are very useful as light sources for recording in the direct production of printing plates from digital computer data. Accordingly, recently, the demand has increased for image recording materials which are highly sensitive to such infrared light sources for recording, i.e., image recording materials in which a photochemical reaction or the like is caused by infrared irradiation and the solubility in a developer is thereby greatly changed.

As an example of such image recording materials on which images can be recorded by using an infrared laser, a recording material comprising an onium salt, a phenol resin and a spectral sensitizing agent is disclosed in U.S. Pat. No. 4,708,925. This image recording material is a positive-type image recording material utilizing a dissolution suppressing effect with respect to the developer, which effect is due to the onium salt and the phenol resin.

The energy of an infrared ray is lower than that of an ultraviolet ray which has been conventionally used as a light source for exposure. Therefore, it is difficult to initiate, by exposure to infrared rays, a light reaction or the like of a compound, which light reaction causes a great change in the solubility of an image recording material with respect to a developer. For example, in WO 97/39894, there is disclosed an image recording material comprising an infrared absorbing agent and a polymeric binder which is soluble in an alkaline aqueous solution. The surface of the image recording material onto which a laser is irradiated has excellent positive action (i.e., development is suppressed in unexposed portions, and development is suppressed only a little or not at all in exposed portions) as a result of the photothermal effect. However, heat generated near the surface of the image recording material does not sufficiently reach the deep portions of the material, and therefore, the positive action at the deep portions is not sufficient. Consequently, even if development is carried out with an alkali developer, the discrimination between the unexposed portions and the exposed portions is not clear, and drawbacks arise in terms of sensitivity and development latitude.

Further, Japanese Patent Application Laid-Open (hereinafter abbreviated as "JP-A") No. 7-20629 proposes an image recording material in which a diazonium salt having a high ability to decompose due to heat is added as a photothermal decomposition material. Although the image recording material has improved sensitivity to infrared lasers and development latitude, the storage stability thereof is poor, and the material has drawbacks in terms of product control.

SUMMARY OF THE INVENTION

The present invention is intended to overcome the above-described conventional drawbacks and to achieve the following object. Namely, the object of the present invention is to provide a positive-type planographic printing material which makes it possible to directly make a printing plate from digital data such as from a computer by using a solid state laser or a semiconductor laser emitting an infrared ray, and which exhibits high sensitivity to infrared lasers and has excellent development latitude and storage stability.

The present inventors focused on the constituent components of positive-type planographic materials which allow direct formation of printing plates by irradiation of infrared rays, and achieved the present invention after learning, as a result of intensive studies, that by lowering the $pK_a$ value of phenolic hydroxyl groups in a polymeric binder, interactions between hydroxyl groups and interactions between a hydroxyl group and an infrared absorbing agent or the like can be improved, changes of the material with the passage of time after forming of a film can be suppressed, and furthermore, the solubility of the material in an alkali developer at the exposed portions can be improved.

The means for achieving the above-mentioned object is as follows. Namely, there is provided a positive-type planographic printing material comprising: (A) a water-insoluble and alkaline water-soluble polymer including a main chain and a side chain and having a phenol structure at at least one of the main chain and the side chain, the phenol structure having an aromatic ring and at least one electron-withdrawing substituent on the aromatic ring; and (B) an infrared absorbing agent.

DESCRIPTION OF THE PREFERRED EMBODIMENTS

Hereinafter, the positive-type planographic printing material in accordance with the present invention will be described in more detail.

The positive-type planographic printing material in accordance with the present invention comprises at least (A) a water-insoluble and alkaline water-soluble polymer including a main chain and a side chain and having a phenol structure at at least one of the main chain and the side chain, the phenol structure having an aromatic ring and at least one electron-withdrawing substituent on the aromatic ring (hereinafter referred to as the "specific alkaline water-soluble polymer"), (B) an infrared absorbing agent, and other components as occasion demands.

(A) Specific Alkaline Water-soluble Polymer

The present invention is characterized in that the specific alkaline water-soluble polymer has, at at least one of the main chain and a side chain, a phenol structure which has an electron-withdrawing substituent.

The electron-withdrawing substituent serves to lower the $pK_a$ value of a phenolic hydroxyl group in the specific alkaline water-soluble polymer. By lowering the $pK_a$ value of the phenolic hydroxyl group, the interactions between the hydroxyl groups and the interactions between the hydroxyl group and the infrared absorbing agent or the like become strong, and therefore, dense network of bondings can be formed. Further, by lowering the $pK_a$ value of the phenolic hydroxyl group, the solubility of the positive-type planographic printing material in an alkali developer at the exposed portions of the material can be improved, and high sensitivity and high development latitude can be obtained. Furthermore, since the phenolic hydroxyl groups in a film have strong interactions in a reticular form, the material is hardly affected by external factors such as humidity and temperature and can be maintained in a stable state in terms of energy. As a result, storage stability over a long period of time can be improved.

As described above, the electron-withdrawing substituent serves to lower the $pK_a$ value of the phenolic hydroxyl groups in the specific alkaline water-soluble polymer. The $pK_a$ value of the phenolic hydroxyl groups is preferably 9.5 or less, and more preferably 9.0 or less.

When the $pK_a$ value exceeds 9.5, the interactions between the phenolic hydroxyl groups become weak, and it becomes difficult to maintain a stable state. Consequently, storage stability may deteriorate.

The electron-withdrawing substituent is not particularly limited as long as it attracts more electrons than hydrogen. However, the substituent preferably has a Hammett's substituent constant $\sigma_{para}$ (hereinafter simply referred to as the "σ value") of 0.05 or more, and more preferably 0.20 or more.

When the electron-withdrawing substituent has a σ value of less than 0.05, it may be difficult to achieve a $pK_a$ value of the phenolic hydroxyl group of 9.5 or less.

Concrete examples of the electron-withdrawing substituents include halogen atoms such as chlorine (σ value: 0. 30), bromine (σ value: 0.27), iodine (σ value: 0. 30), and fluorine (σ value: 0.06); carbonyl-containing substituents such as an acyl group (σ value: 0.46 to 0.50), an aldehyde group (σ value: 0.22), an alkoxycarbonyl group (σ value: 0.39 to 0.45), an aryloxycarbonyl group, an aminocarbonyl group (σ value: 0.36), a carboxyl group (σ value: 0.41), and an acyloxy group (σ value: 0.31); sulfur-containing substituents such as an alkylsulfinyl group (σ value: 0.49), an arylsulfinyl group, an alkylsulfonyl group (σ value: 0.73), an arylsulfonyl group, a sulfonate group, a sulfonic group (σ value: 0.50), a trifluoromethylthio group (σ value: 0.38), an acylthio group (σ value: 0.44), a trifluoromethylsulfonyl group (σ value: 0.93), and an aminosulfonyl group (σ value: 0.57); a perfluoroalkyl group such as a trifluoromethyl group (σ value: 0.54); a cyano group (σ value: 0.66); a nitro group (σ value: 0.78); a di(trifluoromethyl)amino group (σ value: 0.53); a nitroso group (σ value: 0.12); a sulfonamide group, and the like.

These electron-withdrawing substituents may have a substituent. The σ value of electron-withdrawing substituents having a substituent is preferably 0.05 or less.

Concrete examples of the acyl group include an acetyl group (σ value: 0.50), a benzoyl group (σ value: 0.46), an ethylcarbonyl group, an n-propylcarbonyl group, and the like.

Concrete examples of the alkoxycarbonyl group include a methoxycarbonyl group (σ value: 0.39), an ethoxycarbonyl group (σ value: 0.45), an n-propyloxycarbonyl group, an alkyleneoxycarbonyl group linked to a polymer chain, and the like.

Concrete examples of the alkylsulfinyl group include a methylsulfinyl group (σ value: 0.49), an ethylsulfinyl group, and the like.

Concrete examples of the arylsulfinyl group include a phenylsulfinyl group, a tolylsulfinyl group, and the like.

Concrete examples of the alkylsulfonyl group include a methylsulfonyl group (σ value: 0.72), an ethylsulfonyl group, an n-propylsulfonyl group, an alkylenesulfonyl group linked to a polymer chain, and the like.

Concrete examples of the arylsulfonyl group include a phenylsulfonyl group, a tolylsulfonyl group, an arylenesulfonyl group linked to a polymer chain, and the like.

Among these groups, a chlorine atom, an acyl group, a nitro group, a cyano group, an alkoxycarbonyl group, an arylsulfonyl group, and an aldehyde group are more preferable, considering the availability thereof, the ease of synthesis of the alkaline water-soluble polymer, and their sufficient electron attracting property.

The specific alkaline water-soluble polymer is a polymer characterized by having a structural unit containing at least one electron-withdrawing substituent on an aromatic ring in the phenol structure (hereinafter, this structural unit is referred to as the "specific monomer") and by its insolubility in water and solubility in alkaline water.

Accordingly, the positive-type planographic printing material in accordance with the present invention can be developed with an alkali developer.

The phenol structure may exist at at least one of the main chain and a side chain of the polymer or may exist at both. The "phenol structure" refers to a phenol skeleton in the case of the main chain and a phenol group in the case of a side chain of the polymer.

Moreover, at least one electron-withdrawing substituent may exist on the aromatic ring in the phenol structure, or two or more may exist thereon. Further, two or more types of electron-withdrawing substituents may exist on one aromatic ring.

Although concrete examples of the specific monomers are given below, the present invention is not limited to these monomers. The values in parentheses represent the $pK_a$ values of the phenolic hydroxyl groups in the respective specific monomers (estimated values determined from the monomer structures). The same holds for the $pK_a$ values in the Examples which will be described later.

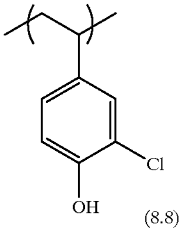
(8.8)

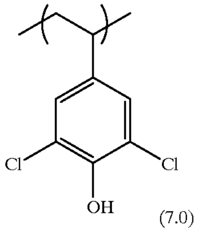
(7.0)

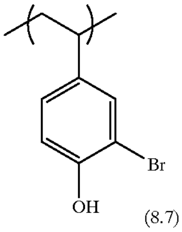
(8.7)

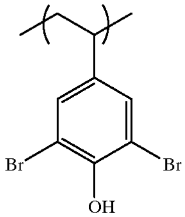

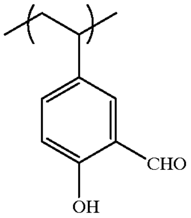

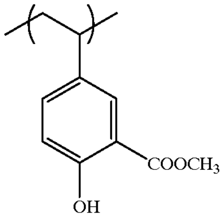

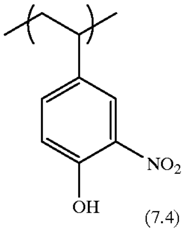
(7.4)

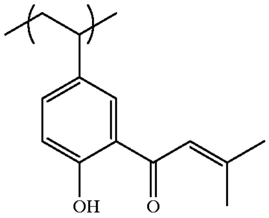

-continued
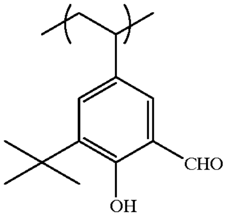
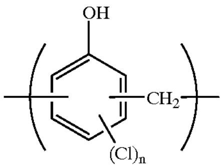
n = 1, 2
(7~9)
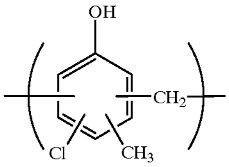
(8.5~9.5)
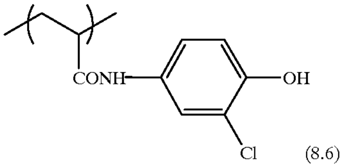
(8.6)
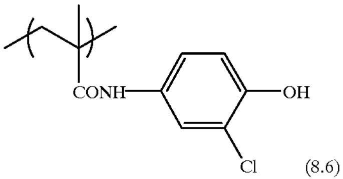
(8.6)
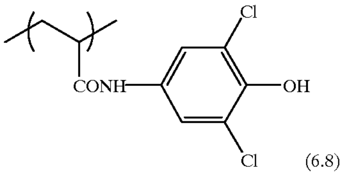
(6.8)
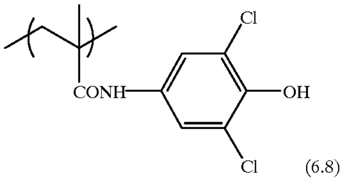
(6.8)
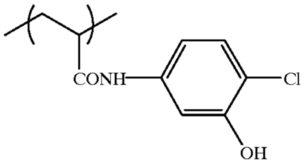
(8.6)
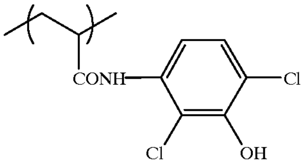
(6.7)
-continued
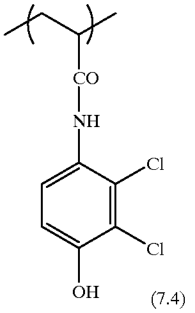
(7.4)
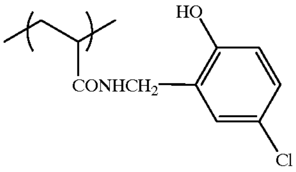
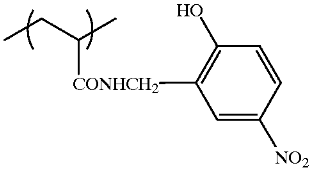
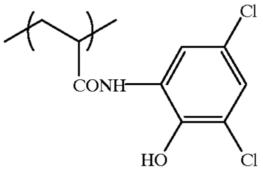
(7.2)
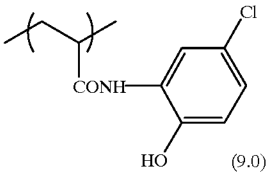
(9.0)
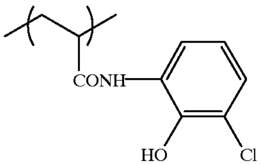
(8.0)
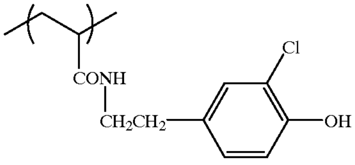
(8.8)
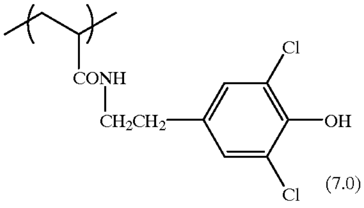
(7.0)
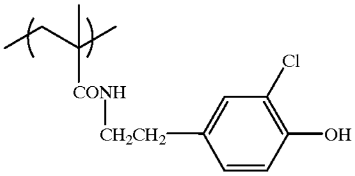
(8.8)

-continued
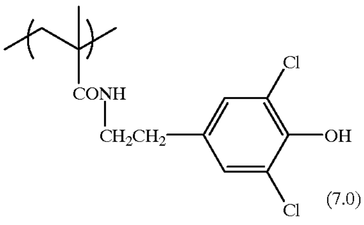
(7.0)
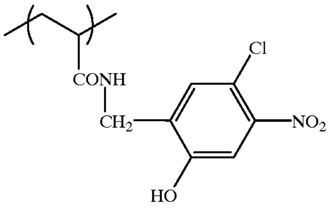
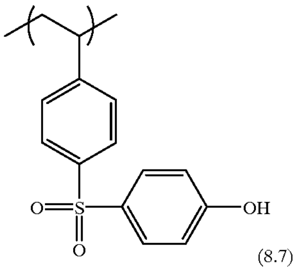
(8.7)
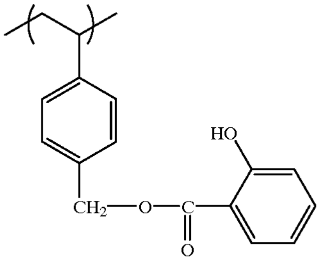
(9.2)
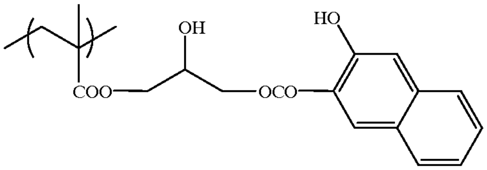
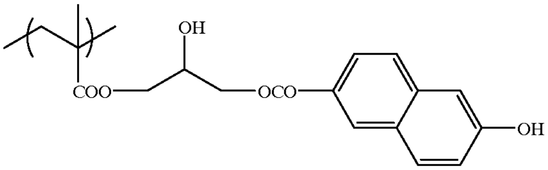
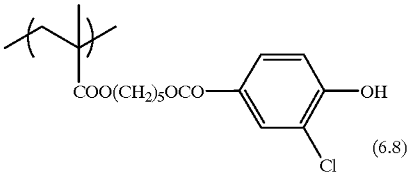
(6.8)
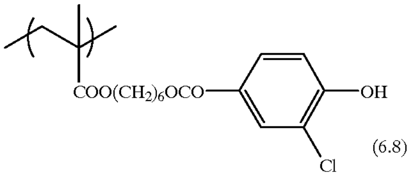
(6.8)
-continued
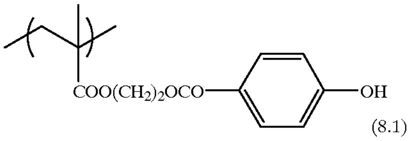
(8.1)
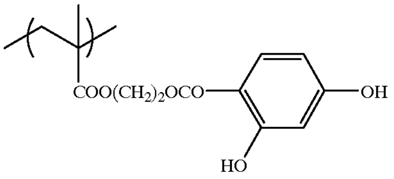
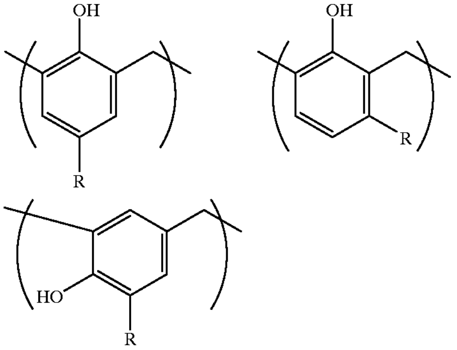
R = Cl, Br, I, —COCH$_3$, NO$_2$, F
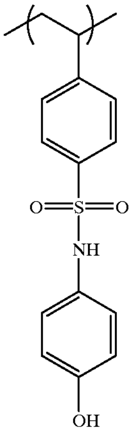
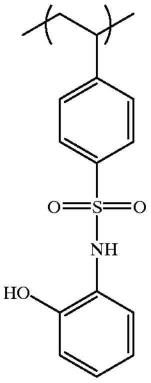
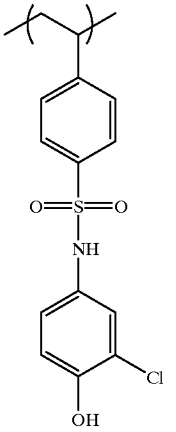
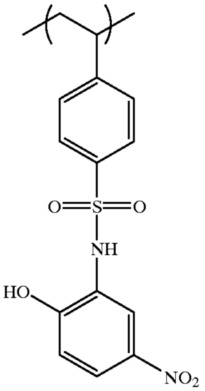
The specific alkaline water-soluble polymer may be a homopolymer comprised of the specific monomers, a copolymer comprised of two or more types of the specific monomers, a copolymer comprised of at least one specific monomer and copolymerized components other than the specific monomers (hereinafter such copolymerized components are referred to as “other copolymerized components”), or a mixture thereof. Further, the specific alkaline water-soluble polymer may be a mixture of any of the above and a polymer comprised of monomers other than the specific monomers.

When the specific alkaline water-soluble polymer is a copolymer of at least one specific monomer and other copolymerized components, or is a mixture as described above, the content of the at least one specific monomer with respect to the specific alkaline water-soluble polymer is preferably 1 to 80 mol %, and more preferably 2 to 60 mol % or more.

When the content of the at least one specific monomer with respect to the specific alkaline water-soluble polymer is less than 1 mol %, the number of the phenolic hydroxyl groups having strong interactions is decreased, and storage stability may deteriorate. On the other hand, if the content exceeds 80 mol %, solubility in alkali becomes too high, and the image formation property may deteriorate.

Further, it suffices for the specific alkaline water-soluble polymer to have the specific monomer as a structural unit, and the specific monomer does not necessarily have to be used as the starting material. That is, when monomers having a form of lacking the electron-withdrawing substituents from the specific monomers are used as the starting materials, the specific alkaline water-soluble polymer having the specific monomers as the structural units can be obtained by introducing the electron-withdrawing substituents into the monomers by a polymer reaction after homopolymerization or copolymerization of the monomers.

Preferable examples of the other copolymerized components include: (1) a monomer having, in a molecule, a sulfonamide group in which at least one hydrogen atom is bonded to a nitrogen atom (hereinafter referred to as “monomer (1)”); (2) a monomer having, in a molecule, an active imino group represented by the following formula (hereinafter referred to as “monomer (2)”); and (3) acrylamide, methacrylamide, acrylic ester, methacrylic ester, or hydroxystyrene, each having a phenolic hydroxyl group (hereinafter referred to as “monomer (3)”).

Monomer (1) comprises, in a molecule, a sulfonamide group in which at least one hydrogen atom is bonded to a nitrogen atom, and a low molecular weight compound having one or more unsaturated bonds which can be polymerized. Preferred among these is a low molecular weight compound having an acryloyl group, an allyl group or a vinyloxy group, and a substituted or mono-substituted aminosulfonyl group or a substituted sulfonylimino group.

Examples of such a compound include compounds represented by the following general formulae (1) to (5):

General Formula (1)

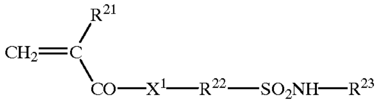

General Formula (2)

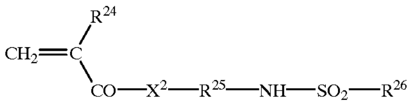

-continued

General Formula (3)

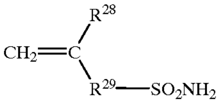

General Formula (4)

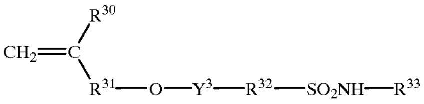

General Formula (5)

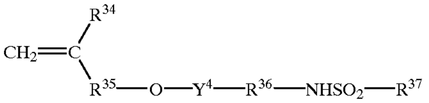

In the formulae, $X^1$ and $X^2$ each independently represent —O—or —$NR^{27}$—. $R^{21}$ and $R^{24}$ each independently represent a hydrogen atom or —$CH_3$. $R^{22}$, $R^{25}$, $R^{29}$, $R^{32}$ and $R^{36}$ each independently represent an alkylene group, a cycloalkylene group, an arylene group or an aralkylene group, each of which has 1 to 12 carbon atoms and may have a substituent. $R^{23}$, $R^{27}$ and $R^{33}$ each independently represent a hydrogen atom or an alkyl group, a cycloalkyl group, an aryl group or an aralkyl group, each of which has 1 to 12 carbon atoms and may have a substituent. Further, $R^{26}$ and $R^{37}$ each independently represent an alkyl group, a cycloalkyl group, an aryl group or an aralkyl group, each of which has 1 to 12 carbon atoms and may have a substituent. $R^{28}$, $R^{30}$ and $R^{34}$ each independently represent a hydrogen atom or —$CH_3$. $R^{31}$ and $R^{35}$ each independently represent an alkylene group, a cycloalkylene group, an arylene group or an aralkylene group, each of which has 1 to 12 carbon atoms and may have a single bond or a substituent. $Y^3$ and $Y^4$ each independently represent a single bond or —CO—.

Specifically, m-aminosulfonylphenyl methacrylate, N-(p-aminosulfonylphenyl)methacrylamide, N-(p-aminosulfonylphenyl)acrylamide, or the like can be preferably used.

Monomer (2) comprises, in a molecule, an active imino group represented by the following formula, and a low molecular weight compound having one or more unsaturated bonds which can be polymerized.

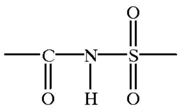

Specifically, N-(p-toluenesulfonyl)methacrylimide, N-(p-toluenesulfonyl)acrylimide, or the like can be preferably used as monomer (2).

Monomer (3) is acrylamide, methacrylamide, acrylic ester, methacrylic ester or hydroxystyrene, each of which has a phenolic hydroxyl group.

Concrete examples of such a compound include

N-(2-hydroxyphenyl)acrylamide, N-(3-hydroxyphenyl) acrylamide,

N-(4-hydroxyphenyl)acrylamide,

N-(2-hydroxyphenyl)methacrylamide,

N-(3-hydroxyphenyl)methacrylamide,

N-(4-hydroxyphenyl)methacrylamide, o-hydroxyphenylacrylate, m-hydroxyphenylacrylate, p-hydroxyphenylacrylate, o-hydroxyphenylmethacrylate, m-hydroxyphenylmethacrylate, p-hydroxyphenylmethacrylate, o-hydroxystyrene, m-hydroxystyrene, p-hydroxystyrene, 2-(2-hydroxyphenyl)ethylacrylate, 2-(3-hydroxyphenyl)ethylacrylate, 2-(4-hydroxyphenyl)ethylacrylate, 2-(2-hydroxyphenyl)ethylmethacrylate, 2-(3-hydroxyphenyl)ethylmethacrylate, 2-(4-hydroxyphenyl)ethylmethacrylate, and the like.

Preferable examples of the other copolymerized components include monomers (1) to (3). However, examples of other copolymerized components which can be used other than these monomers include the following monomers (4) to (18):

(4) a monomer having a carboxylic acid group, e.g., a monomer having in the molecule one or more carboxylic acid groups and one or more polymerizable unsaturated groups;

(5) a monomer having a sulfonic acid group, e.g., a monomer having in the molecule one or more sulfonic acid groups and one or more polymerizable unsaturated groups;

(6) a monomer having a phosphoric acid group, e.g., a monomer having in the molecule one or more phosphoric acid groups and one or more polymerizable unsaturated groups;

(7) acrylic esters and methacrylic esters having an aliphatic hydroxyl group such as 2-hydroxyethylacrylate or 2-hydroxyethylmethacrylate;

(8) alkylacrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate;

(9) alkylmethacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate;

(10) acryl amides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide;

(11) vinyl ethers such as ethylvinyl ether, 2-chloroethylvinyl ether, hydroxyethylvinyl ether, propylvinyl ether, butylvinyl ether, octylvinyl ether, and phenylvinyl ether;

(12) vinyl esters such as vinyl acetate, vinyl chloroacetate, vinyl butylate, and vinyl benzoate;

(13) styrenes such as styrene, $\alpha$-methylstyrene, methylstyrene, and chloromethylstyrene;

(14) vinyl ketones such as methylvinyl ketone, ethylvinyl ketone, propylvinyl ketone, and phenylvinyl ketone;

(15) olefins such as ethylene, propylene, isobutylene, butadiene, and isoprene;

(16) N-vinylpyrrolidone, N-vinylcarbazole, 4-vinylpyridine, acrylonitrile, and methacrylonitrile;

(17) unsaturated imides such as maleimide, N-acryloylacrylamide, N-acetylmethacrylamide, N-propionylmethacrylamide, and N-(p-chlorobenzoyl) methacrylamide; and

(18) unsaturated carboxylic acids such as acrylic acid, methacrylic acid, maleic anhydride, and itaconic acid.

Moreover, other preferable examples of the other polymerized components include a monomer, other than monomer (3), having a phenol structure in which the electron-withdrawing substituent is not bonded to the aromatic ring.

Further, a polymer comprised of such monomers can be added as a mixture to the homopolymer comprised of the specific monomers or the copolymer comprising the specific monomers. Examples of the polymer include novolak resins such as a condensation polymer of phenol and formaldehyde, a condensation polymer of m-cresol and formaldehyde, a condensation polymer of p-cresol and formaldehyde, a condensation polymer of m-/p-mixed cresol and formaldehyde, and a condensation polymer of phenol, cresol (any of m-cresol, p-cresol, and m-/p-mixed cresol) and formaldehyde; and a condensation polymer of pyrogallol and acetone.

Conventionally known copolymerization methods such as graft copolymerization, block copolymerization and random copolymerization can be used as the copolymerization method.

The specific alkaline water-soluble polymer, regardless of whether it is a homopolymer or a copolymer, preferably has a weight average molecular weight of $1.0\times10^3$ to $2.0\times10^5$ and a number average molecular weight of $5.0\times10^2$ to $1.0\times10^5$ from the standpoints of sensitivity and development latitude. Further, the specific alkaline water-soluble polymer preferably has a polydispersity (weight average molecular weight/number average molecular weight) of 1.1 to 10.

The specific alkaline water-soluble polymer is used in a range of preferably 30 to 99% by weight, more preferably 40 to 95% by weight, and particularly preferably 50 to 90% by weight, based on the total solids of the positive-type image recording material. When the used amount of the specific alkaline water-soluble polymer is less than 30% by weight, durability of the recording layer tends to deteriorate. On the other hand, when the used amount of the polymer exceeds 99% by weight, sensitivity and durability tend to deteriorate. Therefore, these amounts are not preferable.

Examples of solvents which can be used for the synthesis of the specific alkaline water-soluble polymer include tetrahydrofuran, ethylenedichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetoamide, toluene, ethyl acetate, methyl lactate, ethyl lactate, dimethylsulfoxide, and water. These solvents may be used alone or a combination of two or more may be used.

(B) Infrared Absorbing Agent

In the positive-type planographic printing material in accordance with the present invention, conventionally well-known infrared absorbing agents can be used as the infrared absorbing agent. However, since the positive action (namely, development is suppressed in unexposed portions, and development is suppressed only a little or not at all in exposed portions) must occur between the structural units of the polymer, an infrared absorbing agent having an onium salt type structure is preferable.

Specifically, dyes such as cyanine dyes and pyrylium salts can be preferably used. Examples of preferable dyes include cyanine dyes disclosed in JP-A Nos. 58-125246, 59-84356, 59-202829, and 60-78787, and cyanine dyes disclosed in GB Patent No. 434,875.

Further, near infrared absorption sensitizing agents disclosed in U.S. Pat. No. 5,156,938 can be preferably used. Furthermore, substituted aryl benzo(thio)pyrylium salts disclosed in U.S. Pat. No. 3,881,924, trimethyne thiapyrylium salts disclosed in JP-A No. 57-142645 (U.S. Pat. No. 4,327, 169), pyrylium compounds disclosed in JP-A Nos. 58-181051, 58-220143, 59-41363, 59-84248, 59-84249, 59-146063, and 59-146061, cyanine dyes disclosed in JP-A No. 59-216146, pentamethyne thiopyrylium salts disclosed in U.S. Pat. No. 4,283,475, and pyrylium compounds disclosed in Japanese Patent Application Publication (hereinafter abbreviated as "JP-B") Nos. 5-13514 and 5-19702 can be preferably used as well.

Moreover, the near infrared absorption dyes represented by formulae (I) and (II) in U.S. Pat. No. 4,756,993 are also examples of preferable dyes.

Further, the anionic infrared absorbing agent disclosed in Japanese Patent Application No. 10-79912 can be preferably used as well. An anionic infrared absorbing agent refers to an agent which has no cationic structure but has an anionic structure in the nuclei of the pigment, which substantially absorbs infrared rays.

For example, an anionic metal complex (c1), anionic carbon black (c2), anionic phthalocyanine (c3), and a compound (c4) represented by the following general formula (6) are examples of anionic infrared absorbing agents. Counter cations of these anionic infrared absorbing agents are monovalent cations containing a proton or polyvalent cations.

$\{G_a^- — M — G_b\}_m X^{m+}$ General Formula (6)

In general formula (6), $G_a^-$ represents an anionic substituent, and $G_b$ represents a neutral substituent. $X^{m+}$ represents a cation having a valence of 1 to m and containing a proton, and m represents an integer of 1 to 6.

The anionic metal complex (c1) refers to a metal complex in which the central metal of the complex portion which substantially absorbs light, and the whole of the metal complex including ligands become anions.

An example of the anionic carbon black (c2) is carbon black to which anionic groups such as sulfonic acid, carboxylic acid and phosphonic acid are bonded as substituents. In order to introduce these groups into the carbon black, steps can be taken such as oxidizing the carbon black with a predetermined acid, as described in "Carbon Black Handbook", Third Edition, edited by The Carbon Black Association and published on Apr. 5, 1995 by The Carbon Black Association, p. 12.

An anionic infrared absorbing agent, in which an onium salt is ion bonded as a counter cation to an anionic group of the anionic carbon black, is preferably used in the present invention.

The anionic phthalocyanine (c3) refers to a compound in which the anionic group mentioned above in the description of (c2) is bonded as a substituent to a phthalocyanine skeleton such that an anion is formed on the whole.

Next, a detailed description will be given of the compounds represented by above general formula (6) of (c4).

In general formula (6), M represents a conjugated chain, which may have a substituent or a ring structure. The conjugated chain M can be represented by the following formula.

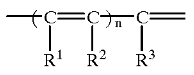

In the formula, $R^1$, $R^2$ and $R^3$ each independently represent a hydrogen atom, a halogen atom, a cyano group, an alkyl group, an aryl group, an alkenyl group, an alkinyl group, a carbonyl group, a thio group, a sulfonyl group, a sulfinyl group, an oxy group, or an amino group and may be linked to one another so as to form a ring structure. n represents an integer of 1 to 8.

Among the anionic infrared absorbing agents represented by general formula (6), the following infrared absorbing agents A-1 through A-19 are preferably used.

A-1

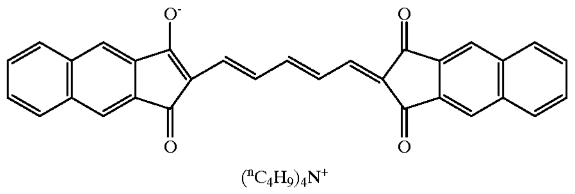

A-2

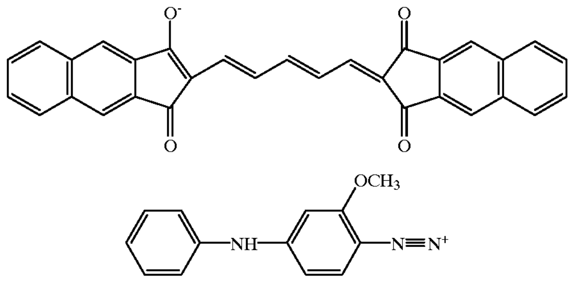

A-3

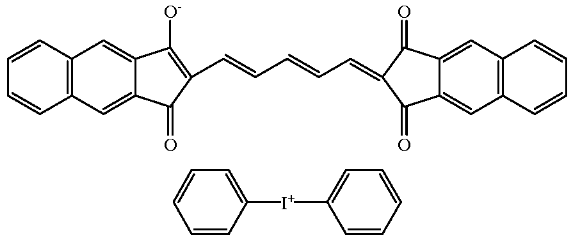

A-4

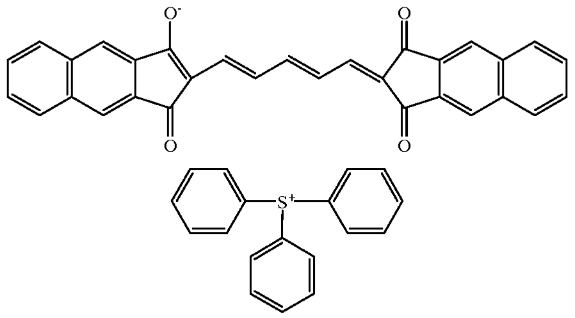

A-5

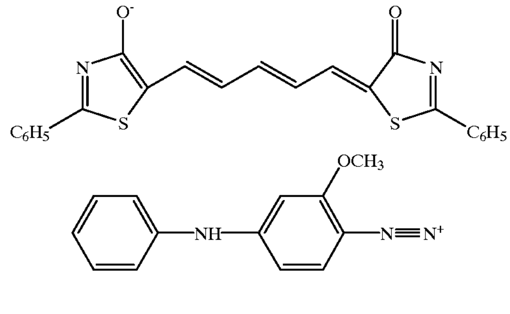

-continued
A-6
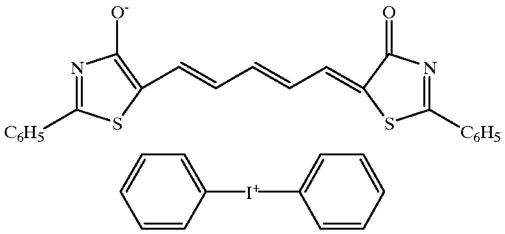
A-7
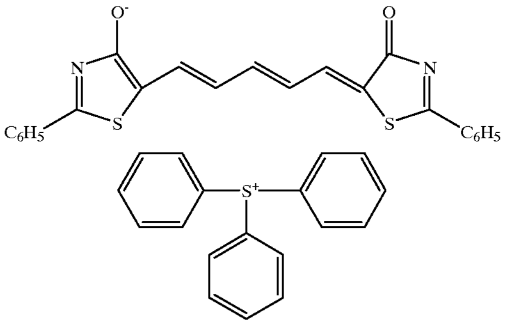
A-8
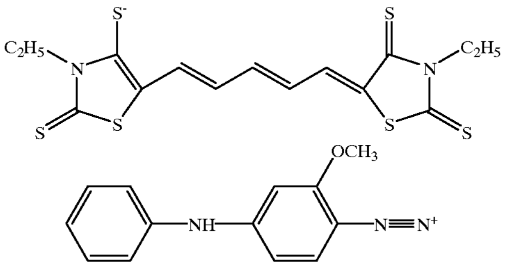
A-9
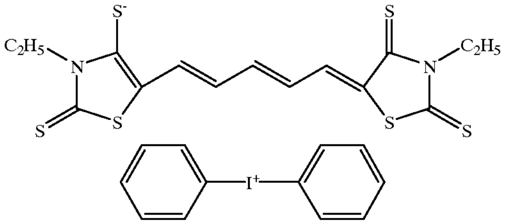
A-10
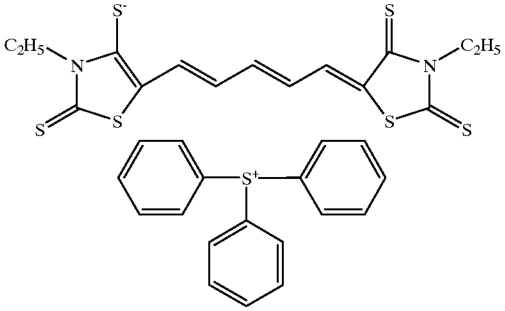
-continued
A-11
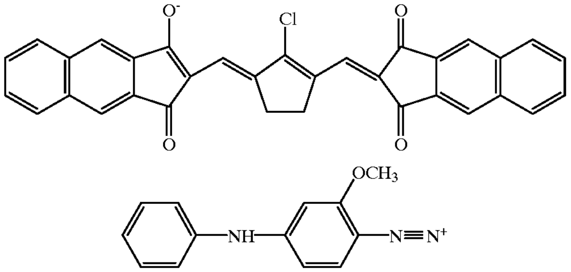
A-12
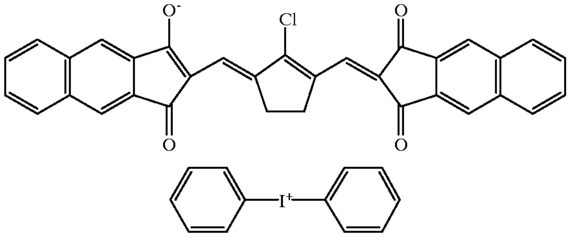
A-13
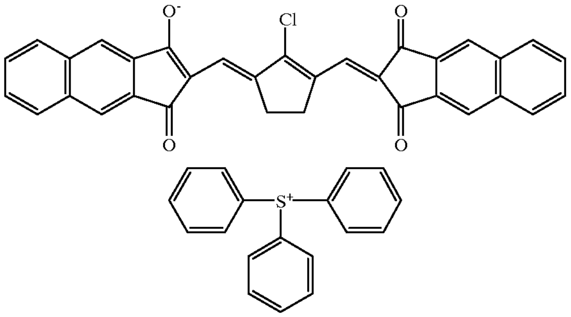
A-14
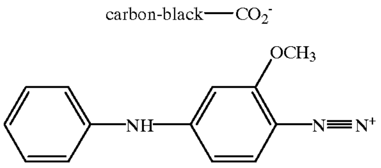
A-15
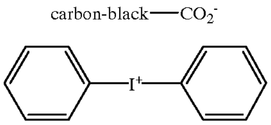
A-16
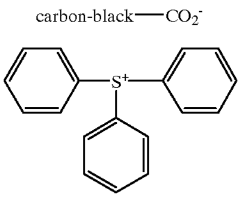

-continued

A-17

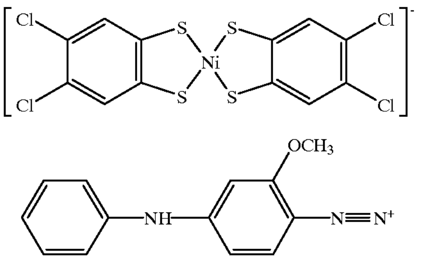

A-18

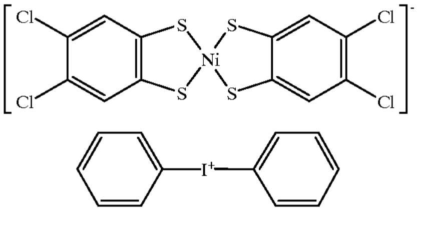

A-19

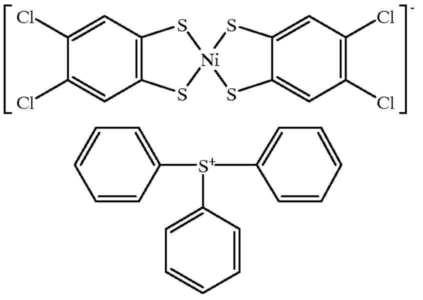

These dyes can be added to the planographic printing material in an amount of 0.01 to 50% by weight, preferably 0.1 to 10% by weight, and particularly preferably 0.5 to 10% by weight, with respect to the total solids of the planographic printing material. When the amount of the dyes to be added is less than 0.01% by weight, sensitivity is decreased. When the amount to be added exceeds 50% by weight, stains are formed in non-image portions at the time of printing.

The positive-type planographic printing material of the present invention may also comprise other dyes, pigments or the like for the purpose of further improving sensitivity and development latitude.

As for the dyes, known dyes such as those commercially available or disclosed in the literature (such as "Dye Handbook"edited by The Organic Synthetic Chemistry Association, published in 1970) can be used. Specifically, examples of dyes include azo dyes, metal complex azo dyes, pyrazolone azo dyes, naphthoquinone dyes, anthraquinone dyes, phthalocyanine dyes, carbonium dyes, quinoneimine dyes, methyne dyes, squalilium dyes, metal thiolate complexes, aluminum dyes, and diimonium pigments.

Further, pigments which can be used include commercially available pigments and those disclosed in the Color Index (C. I.) Handbook, "Modern Pigment Handbook" edited by The Japan Pigment Technology Association, published in 1977; "Modern Pigment Application Technology" by CMC Press, published in 1986; and "Printing Ink Technology" by CMC Press, published in 1984.

Examples of pigments include black pigments, yellow pigments, orange pigments, brown pigments, red pigments, purple pigments, blue pigments, green pigments, fluorescent pigments, metal powder pigments, and polymer bond pigments. Specifically, insoluble azo pigments, azo lake pigments, condensation azo pigments, chelate azo pigments, phthalocyanine dyes, anthraquinone pigments, perylene and perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black can be used. Carbon black is preferable among these pigments.

These pigments can be used without being subjected to a surface treatment, or can be used after being subjected to a surface treatment.

Examples of surface treatment methods include a method of surface coating with a resin or a wax, a method of adhering a surfactant, and a method of bonding a reactive substance (such as a silane coupling agent, an epoxy compound, or polyisocyanate) with the pigment surface. The above-mentioned surface treatment methods are disclosed in "Natures and Applications of Metal Soaps" by Sachi Press; "Printing Ink Technology" by CMC Press, published in 1984; and "Modern Pigment Application Technology" by CMC Press, published in 1986.

A pigment particle size of 0.01 to 10 μm is preferable, 0.05 to 1 μm is more preferable, and 0.1 to 1 μm is particularly preferable. A pigment particle size smaller than 0.01 μm is not preferable in terms of the stability of the pigment dispersion in an image recording layer coating solution. On the other hand, a pigment particle size larger than 10 μm is not preferable in terms of the uniformity of the image recording layer.

As methods of dispersing a pigment, known dispersing methods employed in ink production or toner production can be used. Examples of dispersing machines include ultrasonic dispersing machines, sandmills, attritors, pearl mills, super mills, ball mills, impellers, dispersers, KD mills, colloid mills, dynatrons, triple roll mills, and pressure kneaders. Details thereof are described in "Modern Pigment Application Technology" by CMC Press, published in 1986.

These dyes or pigments can be added to the planographic printing material preferably in an amount of 0.01 to 50% by weight, more preferably in an amount of 0.1 to 10% by weight, and particularly preferably in an amount of 0.5 to 10% by weight in the case of a dye, and particularly preferably in an amount of 1.0 to 10% by weight in the case of a pigment, based on the total solids of the planographic printing material. An amount of a pigment or a dye of less than 0.01% by weight causes low sensitivity. On the other hand, an amount of more than 50% by weight produces stains in non-image portions at the time of printing.

These dyes or pigments can be added in a layer with other components, or can be added in a layer which is different from the layer containing the other components. Further, among the above-mentioned dyes or pigments, those which absorb infrared rays or near infrared rays are particularly preferable. Furthermore, two or more types of dyes and pigments may be used in combination.

Various additives can be added to the positive-type planographic material in accordance with the present invention. For example, onium salts, aromatic sulfone compounds, and esters of aromatic sulfonic acids which are other than those described above act as thermal decomposition substances. Therefore, addition of such substances is preferable in terms of improving the ability to prevent the dissolution of image portions in the developer.

Examples of the onium salts include diazonium salt, ammonium salt, phosphonium salt, iodonium salt, sulfonium salt, selenonium salt, and arsonium salt. Examples of preferable onium salts used in the present invention include diazonium salts described in S. I. Schlesinger, Photogr. Sci. Eng., 18, 387 (1974), T. S. Bal et al., Polymer, 21, 423 (1980), or JP-A No. 5-158230; ammonium salts described in U.S. Pat. Nos. 4,069,055 or 4,069,056, or JP-A No. 3-140140; phosphonium salts described in D. C. Necker et al., Macromolecules, 17, 2468 (1984), C. S. Wen et al., Tech. Proc. Conf. Rad. Curing ASIA, p. 478, Tokyo (Oct. 1988), U.S. Pat. Nos. 4,069,055 or 4,069,056; iodonium salts described in J. V. Crivello et al., Macromolecules, 10 (6), 1307 (1977), Chem. & Eng. News, p. 31 (Nov. 28, 1988), European Patent No. 104,143, U.S. Pat. Nos. 339,049, 410,201, JP-A Nos. 2-150848 or 2-296514; sulfonium salts described in J. V. Crivello et al., Polymer J. 17, 73 (1985), J. V. Crivello et al., J. Org., Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem Ed., 17, 2877 (1979), European Patent Nos. 370,693, 233,567, 297, 443, 297,442, U.S. Pat. Nos. 4,933,377, 3,902,114, 410,201, 339,049, 4,760,013, 4,734,444, 2,833,827, German Patent Nos. 2,904,626, 3,604,580, or 3,604,581; selenonium salts described in J. V. Crivello et al., Macromolecules, 10 (6), 1307 (1977), or J. V. Crivello et al., J. Polymer Sci., Polymer Chem. Ed., 17, 1047 (1979); and arsonium salts described in C. S. Wen et al., Tech, Proc. Conf. Rad. Curing ASIA, p. 478, Tokyo (Oct. 1988).

Examples of the counter ions of the onium salts described above include a tetrafluoroboric acid, a hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, a dodecylbenzenesulfonic acid, 1-naphtol-5-sulfonic acid, 2-methoxy-4-hydroxy-5-benzoylbenzenesulfonic acid, and p-toluenesulfonic acid.

Among these counter ions, alkylaromatic sulfonic acids such as hexafluorophosphoric acid, triisopropylnaphthalenesulfonic acid, and 2,5-dimethylbenzenesulfonic acid are particularly preferred.

The amount of onium salt to be added is preferably 1 to 50% by weight, more preferably 5 to 30% by weight, and particularly preferably 10 to 30% by weight.

Further, a dye having high absorption in the visible light region can be used as the coloring agent of an image. Preferable dyes include oil soluble dyes and basic dyes.

Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industry, Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), Aizen Spirone Blue C-RH (manufactured by Hodogaya Chemicals, Co., Ltd.), and dyes disclosed in JP-A No.62-293247.

It is preferable to add these dyes so that the image portions and non-image portions can be clearly distinguished after an image is formed. The amount to be added is preferably 0.01 to 10% by weight based on the total solids of the planographic printing material.

Moreover, cyclic acid anhydrides, phenols, and organic acids can also be added to further improve sensitivity.

Examples of the cyclic acid anhydrides include phthalic anhydride, tetrahydrophthalic anhydride, hexahydrophthalic anhydride, 3, 6-endooxy-$\Delta^4$-tetrahydrophthalic anhydride, tetrachlorophthalic anhydride, maleic anhydride, chloromaleic anhydride, $\alpha$-phenylmaleic anhydride, succinic anhydride, and pyromellitic anhydride as described in U.S. Pat. No. 4,115,128.

Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

Examples of the organic acids include sulfonic acids, sulfinic acids, alkylsulfuric acids, phosphonic acids, phosphoric esters and carboxylic acids as described in JP-A Nos. 60-88942 and 2-96755, and specifically include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, ericic acid, lauric acid, n-undecanoic acid, ascorbic acid, and the like.

The amount of the cyclic acid anhydrides, phenols or organic acids is preferably 0.05 to 20% by weight, more preferably 0.1 to 15% by weight, and particularly preferably 0.1 to 10% by weight of the planographic printing material.

In order to carry out even more stable processings under various development conditions, nonionic surfactants disclosed in JP-A Nos. 62-251740 and 3-208514, and ampholytic surfactants disclosed in JP-A Nos. 59-121044 and 4-13149 can be added to the positive-type planographic printing material of the present invention.

Specific examples of nonionic surfactants include sorbitan tristearate, sorbitan monopalmitate, sorbitan triolate, mono glyceride stearate, and polyoxyethylene nonylphenyl ether.

Specific examples of ampholytic surfactants include alkyl di(aminoethyl)glycine, alkyl polyaminoethylglycine hydrochloride, 2-alkyl-N-carboxyethyl-N-hydroxyethyl imidazolinium betaine, and N-tetradecyl-N,N-betaine (for example, commercial name: Amorgen K, manufactured by Dai-Ichi Kogyo Co., Ltd.).

The amount of the above-mentioned nonionic surfactants or ampholytic surfactants is preferably 0.05 to 15% by weight, and more preferably 0.1 to 5% by weight, of the planographic printing material.

A printout agent for obtaining a visible image immediately after heating caused by exposure, or a dye or pigment serving as an image colorant may be added to the positive-type planographic printing material of the present invention.

A representative example of the printout agent is a combination of a compound which releases an acid by heating due to exposure and an organic dye which can form a salt.

Specific examples of such combinations include the combinations of o-naphthoquinonediazide-4-sulfonic acid halogenide and a salt-forming organic dye as described in JP-A Nos. 50-36209 and 53-8128, and the combinations of a trihalomethyl compound and a salt-forming organic dye as described in JP-A Nos. 53-36223, 54-74728, 60-3626, 61-143748, 61-151644 and 63-58440. Trihalomethyl compounds are classified into oxazole-based compounds and triazine-based compounds, and both have excellent stability over time and produce clear printed images.

Further, in terms of storage stability, it is preferable to add an epoxy compound, a vinyl ether compound, a phenol compound having a hydroxymethyl group or an alkoxymethyl group as described in Japanese Patent Application No. 7-18120, or a cross-linking compound having the effect of suppressing alkali dissolution as described in Japanese Patent Application No. 9- 328937.

Moreover, a plasticizer for imparting flexibility to a film may be added to the positive-type planographic printing material of the present invention as occasion demands.

For example, butylphthalyl buthylglycolate, polyethyleneglycol, tributyl citrate, diethyl phthalate, dibutyl phthalate, dihexyl phthalate, dioctyl phthalate, tricrezyl phosphate, tributyl phosphate, trioctyl phosphate, tetrahydrofurfuryl oleate, and an oligomer or polymer of acrylic acid or methacrylic acid can be preferably used as a plasticizer.

A surfactant for improving application properties, such as a fluorine-based surfactant disclosed in JP-A No. 62-170950, can be added to the positive-type planographic printing material of the present invention. The amount to be added is preferably 0.01 to 1% by weight, and more preferably 0.05 to 0.5% by weight of the overall printing material.

Planographic Printing Plate

The positive-type planographic printing material of the present invention is preferably used for the manufacture of a planographic printing plate. The following description is of a method of manufacturing a planographic printing plate using the positive-type planographic printing material of the present invention.

In general, a planographic printing plate is manufactured by dissolving the above-mentioned components in a solvent and applying the resultant solution to an appropriate support. Solvents used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, y-butylolactone, toluene, and water. These solvents are used alone or as a mixture. The concentration of the above-mentioned components (total solids including additives) is preferably 1 to 50% by weight in the solution. The amount (solids) applied onto the support obtained after application and drying is determined according to the purpose for which the printing material is to be used. However, when the printing material is used for a photosensitive printing plate, in general, the applied amount (solids) of the the above-mentioned components is preferably 0.5 to 5.0 $g/m^2$.

As the application method, various methods can be used such as bar coater application, rotation application, spray application, curtain application, dip application, air knife application, blade application, and roll application. As the application amount decreases, the apparent sensitivity increases, but the film characteristics of the photosensitive layer decrease. This applied layer serves as a photosensitive layer in the planographic printing plate.

Examples of the support include dimensionally stable plate-like materials such as paper, paper laminated with plastic (such as polyethylene, polypropylene, and polystyrene), metal plates (such as aluminum, zinc, and copper), plastic films (such as cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and paper or plastic films laminated or deposited with the above-mentioned metals.

A polyester film or an aluminum plate is preferable as a support. In particular, an aluminum plate is preferable since it has good dimensional stability and can be provided at a relatively low cost. Examples of preferable aluminum plates include pure aluminum plates and alloy plates comprising aluminum as the main component and trace quantities of different elements. Furthermore, plastic films to which aluminum is laminated or deposited can also be used. Examples of different elements included in an aluminum alloy include silicon, iron, manganese, copper, magnesium, chrome, zinc, bismuth, nickel, and titanium. The total amount of the different elements in the alloy is preferably 10% by weight or less.

Pure aluminum is particularly preferable. However, since production of a completely pure aluminum is difficult in terms of refining technology, an aluminum alloy containing trace quantities of different elements can be used. The composition of the aluminum plate is not specifically defined, and a known aluminum plate can also be suitably used.

The thickness of the aluminum plate is about 0.1 to 0.6 mm, preferably 0.15 to 0.4 mm, and more preferably 0.2 to 0.3 mm.

Although an aluminum plate with the surface thereof having been roughened is used, prior to roughening, a degreasing treatment with a surfactant, an organic solvent, an aqueous alkaline solution or the like can be conducted for removing the rolling oil on the surface as needed.

The surface roughening treatment of the aluminum plate can be implemented by using various methods, such as a mechanically roughening method, an electrochemically roughening method in which the plate surface is dissolved, and a chemically roughening method in which the plate surface is dissolved selectively. As a mechanical method, known methods such as a ball abrasion method, a brush abrasion method, a blast abrasion method, and a buff abrasion method can be used. As an electrochemically roughening method, a method in which an alternating current or direct current is applied to a plate in an electrolytic solution containing a hydrochloric acid or nitric acid can be used. Further, a method combining the mechanical method and the electrochemically roughening method as disclosed in JP-A No. 54-63902 can also be used.

An aluminum plate to which a surface roughening treatment has been applied may be subjected to an alkaline etching treatment or a neutralizing treatment, if necessary, followed by an anodizing treatment so as to improve the water retention property and the abrasion resistance property of the surface, if desired. As the electrolyte used in the anodizing treatment of the aluminum plate, various electrolytes which form a porous oxide film can be used. In general, sulfuric acid, phosphoric acid, oxalic acid, chromic acid, or a mixture thereof are used. The concentration of the electrolyte is suitably determined according to the type of electrolyte which is used.

Conditions of anodizing are determined according to the type of electrolyte used, and thus cannot be universally specified. However, in general, the following conditions are appropriate: concentration of electrolyte in the solution: 1 to 80% by weight; solution temperature: 5 to 70° C.; current density: 5 to 60 $A/dm^2$; voltage: 1 to 100 V; and period of time over which electrolysis is carried out: 10 seconds to 5 minutes. An amount of anodized film less than 1.0 $g/m^2$ results in insufficient plate wear, scratches being easily produced in non-image portions of the planographic printing plate, and a tendency toward so-called "tinting" which occurs by ink adhering to the scratches.

After the anodizing treatment, a hydrophilic treatment is applied to the aluminum surface, if necessary. Examples of hydrophilic treatments include an alkaline metal silicate (such as an aqueous solution of sodium silicate) method as disclosed in U.S. Pat. Nos. 2,714,066, 3,181,461, 3,280,734 and 3,902,734. In this method, the support is immersed in or subjected to electrolysis with an aqueous solution of sodium silicate. Other examples include a method of treating with potassium fluorozirconate disclosed in JP-B No. 36-22063 and methods of treating with polyvinyl phosphonate disclosed in U.S. Pat. Nos. 3,276,868, 4,153,461, and 4,689,272.

If necessary, a primer layer can be provided between the support and the photosensitive layer. Various organic compounds can be used as a primer layer component. Examples include carboxymethyl cellulose; dextrin; gum arabic; phosphonic acids having an amino group such as 2-amino ethyl phosphonic acid; organic phosphonic acids which may have a substituent, such as phenyl phosphonic acid, naphthyl phosphonic acid, alkyl phosphonic acid, glycerophosphonic acid, methylene diphosphonic acid, and ethylene diphosphonic acid; organic phosphoric acids which may have a substituent, such as phenyl phosphoric acid, naphthyl phosphoric acid, alkyl phosphoric acid, and glycerophosphoric acid; organic phosphinic acids which may have a substituent, such as phenyl phosphinic acid, naphthyl phosphinic acid, alkyl phosphinic acid and glycerophosphinic acid; amino acids such as glycine and β-alanine; and hydrochlorides of amine having a hydroxy group, such as hydrochloride of triethanol amine. The primer layer component is selected from the organic compounds above, and a combination of two or more primer layer components can be used.

An organic primer layer can be formed by either of the following methods: a method of applying, to the aluminum plate, a solution in which the aforementioned organic compound is dissolved in water or in an organic solvent such as methanol, ethanol, methyl ethyl ketone, or a mixed solvent thereof, and the applied solution is dried; or a method of dipping the aluminum plate into a solution in which the aforementioned organic compound is dissolved in water or in an organic solvent such as methanol, ethanol, methyl ethyl ketone, or a mixed solvent thereof so as to cause the plate to adsorb the compound, and then the plate is washed with water and dried so as to form an organic primer layer.

In the former method, a solution having a concentration of the above-mentioned organic compound of 0.005 to 10% by weight can be applied in various manners. In the latter method, the concentration of the organic compound is 0.01 to 20% by weight, and preferably 0.05 to 5% by weight. The dipping temperature is 20 to 90° C., and preferably 25 to 50° C. The dipping time is 0.1 seconds to 20 minutes, and preferably 2 seconds to 1 minute. The pH value of the solution used herein can be adjusted in the range of 1 to 12 by using basic substances such as ammonia, triethylamine or potassium hydroxide, or acidic substances such as hydrochloric acid or phosphoric acid. Further, a yellow dye may be added to the solution to improve the color tone reproduction property of the planographic printing material.

The applied amount of the organic primer layer is suitably 2 to 200 mg/m$^2$, and preferably 5 to 100 mg/m$^2$. If the amount is less than 2 mg/m$^2$ or more than 200 mg/m$^2$, sufficient wear resistance of the plate cannot be obtained.

The planographic printing plate produced as described above is usually subjected to image exposure and developing processing such that an image is formed.

Examples of the light source for an active light beam used in the image exposure include a mercury-arc lamp, a metal halide lamp, a xenon lamp, a chemical lamp, and a carbon arc lamp. Examples of radioactive rays include electron beams, X rays, ion beams, and far infrared rays. Further, g-rays, i-rays, deep UV rays, and high-density energy beams (laser beams) are also used.

Examples of the laser beam include a helium-neon laser, an argon laser, a krypton laser, a helium-cadmium laser, a krypton-fluorine excimer laser, a solid state laser, and a semiconductor laser. Among these, a light source emitting light of wavelengths in the near infrared region to the infrared region is preferable. Particularly preferable are a solid state laser and a semiconductor laser.

Conventionally known aqueous alkaline solutions can be used as the developer and replenishing solution. Examples include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide.

Further, organic alkaline agents such as the following can also be used: monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like.

These alkaline agents may be used alone or a combination of two or more may be used.

Particularly preferable developers among these alkaline agents are an aqueous solution of silicate, such as sodium silicate or potassium silicate. This is because the developing property can be adjusted by the ratio and concentration of silicon dioxide $SiO_2$ which is a component of silicate and an alkali metal oxide $M_2O$ (M represents an alkali metal). For example, alkali metal silicates such as those disclosed in JP-A No. 54-62004 and JP-B No. 57-7427 can be effectively used.

Furthermore, it is known that, in a case in which an automatic developing machine is used for developing, by adding to the developer an aqueous solution (replenishing solution) whose alkalinity is higher than that of the developer, a large amount of planographic printing plates can be developed without changing the developer in the developing tank for a long time. This replenishing method is preferably used.

Various types of surfactants and organic solvents can be added to the developer or the replenishing solution as needed for promoting or suppressing the developing property, and improving the dispersion of developing scum (debris) and the affinity of the printing plate image portions to ink. Examples of preferable surfactants include anionic surfactants, cationic surfactants, nonionic surfactants, and ampholitic surfactants. Further, a reducing agent such as hydroquinone, resorcine, a sodium or potassium salt of an inorganic acid such as sulfurous acid or sulfurous hydracid; an organic carboxylic acid; an antifoamer; and a hard-water softener may also be added to the developer and the replenishing solution as needed.

Planographic printing plates developed by using the above-mentioned developers and replenishing solutions are subjected to a post-treatment with a rinsing solution containing water, a surfactant, or the like, and a desensitizing solution containing gum arabic or a starch derivative. In a case in which the planographic printing material of the present invention is used for a printing plate, these treatments can be used in combination as a post-treatment.

Recently, an automatic developing machine has been widely used in plate making and printing industries in order to streamline and standardize the plate making operation. Planographic printing plates can also be processed by the automatic developing machine. In general, this automatic developing machine comprises a developing section and a post-treatment section, and each section comprises a device for conveying a printing plate, processing solution tanks, and spraying devices. The developing processing is carried out by spraying a processing solution, which is pumped up by a pump, from a spray nozzle onto the printing plate after exposure while the printing plate is horizontally conveyed. In addition, a processing method has also been known recently in which an exposed printing plate is subjected to processing by being immersed in a processing solution tank filled with a processing solution while the printing plate is conveyed in the solution by guide rollers. In such automatic processing, a replenishing solution can be replenished for each treatment in accordance with the amount of printing plates to be developed, the work time, and the like. Further, a so-called disposable processing method, in which a substantially unused processing solution is utilized for treatment, can be applied as well.

In a case in which a planographic printing plate obtained by image exposure, development, washing with water, and/or rinsing and/or gum coating has unnecessary image portions (for example, traces of film edges of the original film or the like), such unnecessary image portions can be removed. It is preferred that removal is carried out by applying a removing solution such as that described in JP-B No. 2-13293 onto the unnecessary image portions, allowing the printing plate to stand for a given period of time, and then washing the printing plate with water. Also, the method described in JP-A No. 59-174842 may be used in which unnecessary image portions are irradiated with an active light beam guided through an optical fiber and the printing plate is developed thereafter.

If desired, a desensitizing gum may be applied to a planographic printing plate which has been subjected to the above-described treatments, and thereafter, the printing plate may be used in a printing process. The plate may be subjected to a burning treatment for the purpose of improving plate wear resistance. In a case in which a burning treatment is applied to a planographic printing plate, prior to the burning treatment, it is preferable to treat the plate with a surface-adjusting solution such as those disclosed in JP-B Nos. 61-2518 and 55-28062, and JP-A Nos. 62-31859 and 61-159655. Examples of methods of treating the planographic printing plate with a surface-adjusting solution include a method of applying the surface-adjusting solution onto the planographic printing plate with a sponge or an absorbent cotton soaked with the surface-adjusting solution, a method of immersing the planographic printing plate in a tray filled with the solution to coat the plate with the solution, and a method of applying the surface-adjusting solution onto the printing plate by an automatic coater. It is more preferable if the applied amount of the surface-adjusting solution is made uniform over the entire surface with a squeegee or a squeegee roller after application. In general, an appropriate amount of the surface-adjusting solution to be applied is 0.03 to 0.8 $g/m^2$ (dry weight).

After the planographic printing plate treated with the surface-adjusting solution is dried, the planographic printing plate may be heated to a high temperature by using a burning processor (such as burning processor BP-1300 commercially available from Fuji Photo Film Co., Ltd.), if necessary. The heating temperature and the heating time depend on the type of components forming the image. However, a heating temperature of 180 to 300° C. and heating time of 1 to 20 minutes are preferable.

If necessary, the planographic printing plate subjected to the burning treatment can further be appropriately subjected to conventional treatments such as washing with water and gum coating. However, in a case in which a surface-adjusting solution containing a water-soluble polymer compound is used, a desensitizing treatment such as gum coating can be omitted.

The planographic printing plate obtained by such treatment is loaded in an offset printing machine and is used for printing of sheets or the like.

EXAMPLES

The present invention will now be described in detail by way of Examples. However, the present invention is not limited to these Examples.

Example 1

Synthesis of Specific Alkaline Water-soluble Polymer A

Twelve parts by weight of m,p-cresol novolak (m/p ratio=6/4, weight average molecular weight: 3,500, containing 0.5% by weight of unreacted cresol) was dissolved in 100 parts by weight of tetrahydrofuran. The resulting solution was stirred at room temperature, and 4 parts by weight of sulfuryl chloride ($SO_2Cl_2$) was slowly added by drops to the solution. After being stirred for 8 hours at room temperature, the reaction solution was poured into 1000 parts by weight of water, and the separated alkaline water-soluble polymer A was removed and washed with water to obtain 13 parts by weight of specific alkaline water-soluble polymer A with a chlorination ratio of 30 mol % (the ratio with respect to the phenolic hydroxyl groups). The $pK_a$ value of the phenolic hydroxyl group into which chlorine was introduced as the electron-withdrawing substituent was 7 to 9.

A photosensitive solution 1 having the following composition was prepared.

| Photosensitive solution 1 | |
|---|---|
| Infrared absorbing agent (IR-1 of the following formula) | 0.20 g |
| Specific alkaline water-soluble polymer A | 1.10 g |
| Dye prepared by replacing the counter anion of Victoria Pure Blue BOH with an anion of 1-naphthalenesulfonic acid | 0.02 g |
| Fluorine-containing surfactant (commercial name: Megafac F-177, manufactured by Dainippon Ink & Chemicals, Inc.) | 0.05 g |
| γ-butylacetone | 3.0 g |
| Methyl ethyl ketone | 8.0 g |
| 1-methoxy-2-propanol | 7.0 g |

[IR-1]

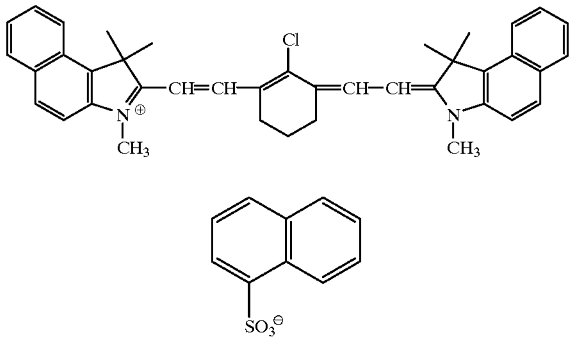

Production of Support

An aluminum plate (material quality: 1050) having a thickness of 0.3 mm was washed with trichloroethylene to remove grease, and then the surface was made coarse with a nylon brush and a suspension of a 400 mesh pumice stone and water, and then was washed well with water. The plate was dipped into a 25% sodium hydroxide aqueous solution at 45° C. for 9 seconds to be etched. After being washed with water, the plate was dipped into 20% nitric acid for 20 seconds and then washed with water. The etched amount of the coarse surface was about 3 g/$m^2$. By direct current-anodic oxidization at a current density of 15A/$dm^2$ using 7% sulfuric acid as an electrolytic solution, a direct current anodically oxidized film of 3 g/$dm^2$ was formed on the plate. Thereafter, the plate was washed with water and dried. Subsequently, the following primer solution was applied to the plate, and the applied film was dried at 90° C. for 1 minute. The amount of the applied film after drying was 10 mg/$m^2$.

| Primer solution | |
|---|---|
| β-alanine | 0.50 g |
| Methanol | 95 g |
| Water | 5.0 g |

A planographic printing plate was produced by applying the photosensitive solution 1 onto the obtained support such that the applied amount was 1.8 g/$m^2$.

Evaluation of Sensitivity and Development Latitude

The obtained planographic printing plate was exposed by using a semiconductor laser having a wavelength of 840 nm. After exposure, the plate was developed by an automatic developing machine (commercial name: "PS Processor 900VR", manufactured by Fuji Photo Film, Co., Ltd.) in which a developer DP-4 (produced by Fuji Photo Film, Co., Ltd.) and a rinsing liquid FR-3 (produced by Fuji Photo Film, Co., Ltd., dilution ratio with water=1:7) were used. The following two types of solutions were used as the developer: DP-4 which was diluted to a 1:6 ratio by volume, and DP-4 which was diluted to a 1:12 ratio.

The line width of non-image portions obtained by using the DP-4 which was diluted to a 1:6 ratio was measured, and the irradiation energy of the laser corresponding to that line width was obtained as a measure of sensitivity (mJ/$cm^2$). The results are shown in Table 1. The smaller the measured value (mJ/$cm^2$), the higher the sensitivity of the planographic printing plate.

Next, the line width of the non-image portions obtained by using the developer diluted to a 1:6 ratio, which is the standard, and the line width of the non-image portions obtained by using the developer diluted to a 1:12 ratio, which is more dilute than the developer diluted to a 1:6 ratio, were measured. Subsequently, the irradiation energy of the laser corresponding to the line widths was determined, and the difference between the sensitivities obtained by using the developers was calculated and used as a measure of development latitude. The results are given in Table 1. The smaller the difference, the better the development latitude. A difference of 20 mJ/$cm^2$ or less means that the printing plate presents substantially no problems in actual use.

Evaluation of Storage Stability

The obtained planographic printing plate was stored for 3 days at a temperature of 60°C. and a relative humidity of 45%. Subsequently, laser exposure and development were carried out in the same manner as described above. Sensitivity was also determined in the same manner as described above, and the difference was determined by comparison with the above-described results and was used as a measure of storage stability. The results are given in Table 1. As long as the variation in sensitivity is 20 mJ/$cm^2$ or less, storage stability is good, and the printing plate presents substantially no problems in actual use.

Example 2

A planographic printing plate was produced and evaluation was carried out in the same way as in Example 1 except that the specific alkaline water-soluble polymer A in the photosensitive solution 1 in Example 1 was replaced with the following specific alkaline water-soluble polymer B. The results are shown in Table 1.

Specific Alkaline Water-soluble Polymer B

The specific alkaline water-soluble polymer B was a mixture of (i) a polymer and (ii) m,p-cresol novolak in a weight ratio of 1/1. In the polymer (i), poly(p-hydroxystyrene) (manufactured by Maruzen Oil Chemicals Co., Ltd., commercial name: Lyncur-MS4P) was chlorinated by sulfuryl chloride (chlorination ratio: 150 mol % with respect to the phenolic hydroxyl groups). The m,p-cresol novolak (ii) had an m/p ratio of 6/4, a weight average molecular weight of 3500, and contained 0.5% by weight of unreacted cresol.

The $pK_a$ value of the phenolic hydroxyl group into which chlorine was introduced as the electron-withdrawing substituent was 7.0 to 8.8.

Example 3

A planographic printing plate was produced and evaluation was carried out in the same way as in Example 1 except that the specific alkaline water-soluble polymer A in the photosensitive solution 1 in Example 1 was replaced with a specific alkaline water-soluble polymer C (p-nitrophenol novolak resin, weight average molecular weight: 6,500) represented by the following formula. The results are shown in Table 1.

The $pK_a$ value of the phenolic hydroxyl group into which a nitro group was introduced as the electron-withdrawing substituent was 7.5.

Polymer C

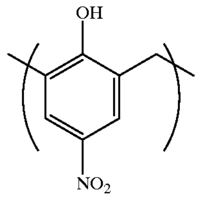

Example 4

A planographic printing plate was produced and evaluation was carried out in the same way as in Example 1 except that the specific alkaline water-soluble polymer A in the photosensitive solution 1 in Example 1 was replaced with the following specific alkaline water-soluble polymer D. The results are given in Table 1.

Specific Alkaline Water-soluble Polymer D

Eighteen parts by weight of 2,6-dichloro-4-aminophenol was dissolved in 100 parts by weight of acetone. Subsequently, 8.4 parts by weight of sodium bicarbonate was added, and the resulting solution was stirred. Ten parts by weight of chloride methacrylate was slowly added to the solution by drops while the solution was cooled with ice, and then the temperature was raised to room temperature and the solution was stirred for 8 hours. Subsequently, the reaction solution was poured into 800 parts by weight of water. Precipitates were filtered and washed with water to obtain 20 parts by weight of a specific monomer. Radical copolymerization of the obtained specific monomer (40 mol %), methyl methacrylate (30 mol %), and acrylonitrile (30 mol %) was conducted by a conventional method to obtain the specific alkaline water-soluble polymer D (weight average molecular weight: 80,000).

The $pK_a$ value of the phenolic hydroxyl group into which chlorine was introduced as the electron-withdrawing substituent was 7.0.

Polymer D

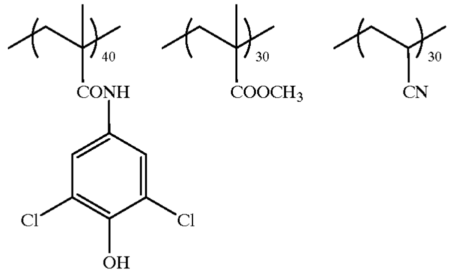

Example 5

A planographic printing plate was produced in the same way as in Example 1 except that the infrared absorbing agent (IR-1) in the photosensitive solution 1 in Example 1 was replaced with an infrared absorbing agent (IR-2) represented by the following formula. Evaluation was carried out in the same way as in Example 1 except that the obtained planographic printing plate was exposed by a YAG laser having a wavelength of 1064 nm instead of by a semiconductor laser having a wavelength of 840 nm. The results are given in Table 1.

[IR-2]

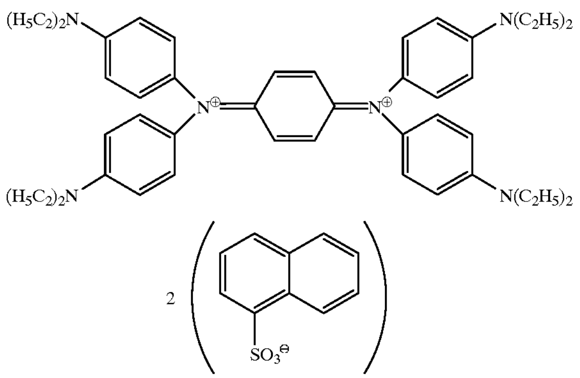

Example 6

A planographic printing plate was produced in the same way as in Example 2 except that the infrared absorbing agent (IR-1) in the photosensitive solution 1 in Example 2 was replaced with the infrared absorbing agent (IR-2). Evaluation was carried out in the same way as in Example 2 except that the obtained planographic printing plate was exposed by a YAG laser having a wavelength of 1064 nm instead of by a semiconductor laser having a wavelength of 840 nm. The results are shown in Table 1.

Example 7

A planographic printing plate was produced in the same way as in Example 3 except that the infrared absorbing agent (IR-1) in the photosensitive solution 1 in Example 3 was replaced with the infrared absorbing agent (IR-2). Evaluation was carried out in the same way as in Example 3 except that the obtained planographic printing plate was exposed by a YAG laser having a wavelength of 1064 nm instead of by a semiconductor laser having a wavelength of 840 nm. The results are shown in Table 1.

Example 8

A planographic printing plate was produced in the same way as in Example 4 except that the infrared absorbing agent (IR-1) in the photosensitive solution 1 in Example 4 was replaced with the infrared absorbing agent (IR-2). Evaluation was carried out in the same way as in Example 4 except that the obtained planographic printing plate was exposed by a YAG laser having a wavelength of 1064 nm instead of by a semiconductor laser having a wavelength of 840 nm. The results are given in Table 1.

Comparative Example 1

A planographic printing plate was produced and evaluation was carried out in the same way as in Example 1 except that the specific alkaline water-soluble polymer A in the photosensitive solution 1 in Example 1 was replaced with an alkaline water-soluble polymer E (m,p-cresol novolak, m/p ratio=6/4, weight average molecular weight: 3,500, containing 0.5% by weight of unreacted cresol). The results are shown in Table 1. The $pK_a$ value of the phenolic hydroxyl group of m,p-cresol novolak was 10.5.

Comparative Example 2

A planographic printing plate was produced and evaluation was carried out in the same way as in Example 5 except that the specific alkaline water-soluble polymer A in the photosensitive solution 1 in Example 5 was replaced with the alkaline water-soluble polymer E (m,p-cresol novolak, m/p ratio=6/4, weight average molecular weight: 3,500, containing 0.5% by weight of unreacted cresol). The results are shown in Table 1.

TABLE 1

| | alkaline water-soluble polymer | exposure wavelength (nm) | sensitivity ($mJ/cm^2$) | development latitude ($mJ/cm^2$) | storage stability ($mJ/cm^2$) |
|---|---|---|---|---|---|
| Example 1 | A | 840 | 130 | 5 | 5 |
| Example 2 | B | 840 | 125 | 5 | 10 |
| Example 3 | C | 840 | 125 | 15 | 10 |
| Example 4 | D | 840 | 130 | 10 | 10 |
| Example 5 | A | 1064 | 130 | 5 | 5 |
| Example 6 | B | 1064 | 125 | 5 | 15 |
| Example 7 | C | 1064 | 130 | 10 | 10 |
| Example 8 | D | 1064 | 135 | 5 | 5 |
| Comparative Example 1 | E | 840 | 140 | 30 | 40 |
| Comparative Example 2 | E | 1064 | 145 | 40 | 40 |

It can be understood from the results of Table 1 that, in comparison with the planographic printing plates of Comparative Examples 1 and 2, the planographic printing plates of Examples 1 through 8 have high sensitivity to infrared lasers and a development latitude which is satisfactory for actual use, and the difference between the sensitivities obtained by using the two types of developers is very small.

Furthermore, compared with the planographic printing plates of Comparative Examples 1 and 2, all of the planographic printing plates of Examples 1 through 8 have a very small variation in sensitivity before and after storage, and therefore exhibit excellent storage stability and are satisfactory for actual use.

The planographic printing material in accordance with the present invention can be used for direct plate formation on the basis of digital signals output from a computer or the like, by using a solid-state laser or semiconductor laser which emits infrared rays. Moreover, the planographic printing plate is highly sensitive to the infrared rays and exhibits excellent development latitude and excellent storage stability over a long period of time.

Accordingly, the planographic printing material in accordance with the present invention is preferably used for printing plates which can be directly formed by infrared lasers.

What is claimed is:

1. A positive-type planographic printing material comprising:

(a) a water-insoluble and alkaline water-soluble polymer including a main chain and having a phenol structure on the main chain, the phenol structure having an aromatic ring and at least one electron-withdrawing substituent on the aromatic ring; and (b) an infrared absorbing agent.

2. A positive-type planographic printing material according to claim 1, wherein a phenolic hydroxyl group of said alkaline water-soluble polymer has a $pK_a$ value of not more than 9.5.

3. A positive-type planographic printing material according to claim 1, wherein the electron-withdrawing substituent has a Hammett's substituent constant $\sigma_{para}$ of at least 0.05.

4. A positive-type planographic printing material according to claim 1, wherein said alkaline water-soluble polymer includes a monomer, the monomer having a structural unit with at least one electron-withdrawing substituent on the aromatic ring of the phenol structure, said alkaline water-soluble polymer being a type of polymer selected from the group consisting of a homopolymer of the monomer, a copolymer of at least two types of the monomers, and a mixture of a homopolymer and a copolymer of at least two types of the monomers.

5. A positive-type planographic printing material according to claim 1, wherein said alkaline water-soluble polymer is a copolymer of at least one type of monomer, the monomer having a structural unit containing at least one electron-withdrawing substituent on the aromatic ring in the phenol structure, and at least one other monomer.

6. A positive-type planographic printing material according to claim 5, wherein the monomer having at least one electron-withdrawing substituent on the aromatic ring in the phenol structure, has a content of 1 to 80 mol % of said alkaline water-soluble polymer.

7. A positive-type planographic printing material according to claim 1, wherein said alkaline water-soluble polymer is a mixture of a homopolymer or a copolymer of a monomer having a structural unit with at least one electron-withdrawing substituent on the aromatic ring of the phenol structure, and a copolymer of other monomers.

8. A positive-type planographic printing material according to claim 7, wherein the monomer having at least one electron-withdrawing substituent on the aromatic ring in the phenol structure, has a content of 1 to 80 mol % of said alkaline water-soluble polymer.

9. A positive-type planographic printing material according to claim 1, wherein said alkaline water-soluble polymer is a mixture of a homopolymer or a copolymer of at least one type of monomer, the monomer having a structural unit containing at least one electron-withdrawing substituent on the aromatic ring in the phenol structure and at least one other monomer, and a copolymer of other monomers.

10. A positive-type planographic printing material according to claim 9, wherein the monomer having at least one electron-withdrawing substituent on the aromatic ring in the phenol structure, has a content of 1 to 80 mol % of said alkaline water-soluble polymer.

11. A positive-type planographic printing plate material according to claim 1, wherein the electron-withdrawing substituent is a halogen.

12. A positive-type planographic printing plate material according to claim 1, wherein the electron-withdrawing substituent is chlorine.

13. A positive-type planographic printing material according to claim 1, wherien said alkaline water-soluble polymer is a mixture of a homopolymer or a copolymer of at least two types of monomers, the monomers each having a structural unit containing at least one electron-withdrawing substituent on the aromatic ring in the phenol structure and at least one other monomer, and a copolymer of other monomers.

* * * * *